(12) United States Patent
Farkas et al.

(10) Patent No.: US 12,471,215 B2
(45) Date of Patent: Nov. 11, 2025

(54) PRINTED CIRCUIT BOARD WITH REDUCED VIA STRIPING

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 211 days.

(21) Appl. No.: 18/361,854

(22) Filed: Jul. 30, 2023

(65) Prior Publication Data

US 2025/0040045 A1    Jan. 30, 2025

(51) Int. Cl.
| | |
|---|---|
| *H05K 1/11* | (2006.01) |
| *H05K 1/02* | (2006.01) |
| *H05K 3/00* | (2006.01) |
| *H05K 3/42* | (2006.01) |

(52) U.S. Cl.
CPC ........... *H05K 1/115* (2013.01); *H05K 1/0298* (2013.01); *H05K 3/0047* (2013.01); *H05K 3/429* (2013.01); *H05K 2201/096* (2013.01)

(58) Field of Classification Search
None
See application file for complete search history.

(56) References Cited

U.S. PATENT DOCUMENTS

| | | | |
|---|---|---|---|
| 2015/0351240 A1* | 12/2015 | Nabeyama | ........... H05K 3/0047 174/266 |
| 2022/0394850 A1 | 12/2022 | Farkas et al. | |
| 2023/0171898 A1 | 6/2023 | Ethridge et al. | |

* cited by examiner

*Primary Examiner* — Timothy J Thompson
*Assistant Examiner* — John B Freal
(74) *Attorney, Agent, or Firm* — Larson Newman, LLP (57) ABSTRACT

A printed circuit board includes a dielectric material, a signal trace on a surface of the dielectric material, a signal layer within the dielectric material, a via including plating, and multiple back drill locations. The plating provides an electrical communication between the signal trace and the signal layer, and the via has a diameter. The back drill locations are along a length of the via beyond the signal layer. A first combined diameter of the back drill locations at a bottom of the back drill locations is equal to the dimeter of the via. A second combined diameter of the back drill locations at a top of the back drill locations is greater than the dimeter of the via.

12 Claims, 5 Drawing Sheets

PRINTED CIRCUIT BOARD WITH REDUCED VIA STRIPING

FIELD OF THE DISCLOSURE

The present disclosure generally relates to information handling systems, and more particularly relates to back drilling a via of a printed circuit board to avoid striping.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A printed circuit board includes a dielectric material, a signal trace on a surface of the dielectric material, a signal layer within the dielectric material, a via including plating, and multiple back drill locations. The plating may provide an electrical communication between the signal trace and the signal layer, and the via has a diameter. The back drill locations may be along a length of the via beyond the signal layer. A first combined diameter of the back drill locations at a bottom of the back drill locations may be equal to the dimeter of the via. A second combined diameter of the back drill locations at a top of the back drill locations may be greater than the dimeter of the via.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
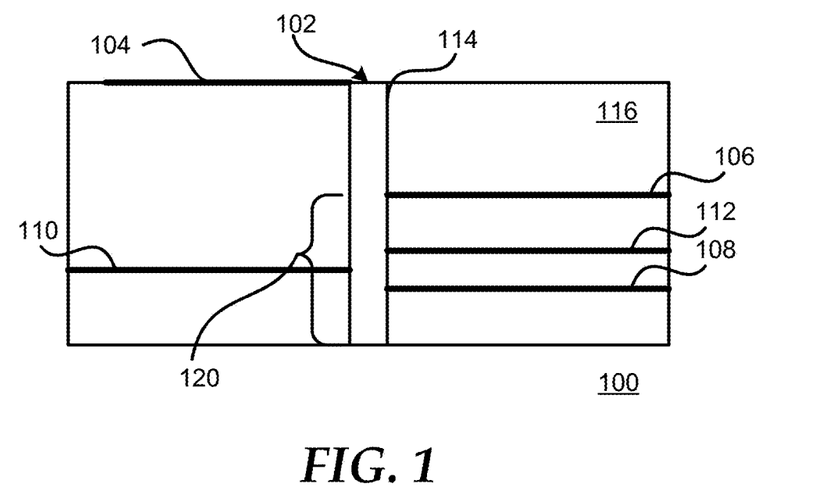
FIG. 1 is a cross-sectional view of a printed circuit board according to at least one embodiment of the present disclosure.

FIG. 1 illustrates a printed circuit board 100 for an information handling system according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Printed circuit board 100 includes a via 102, a signal trace 104, signal layers 106 and 108, ground layers 110 and 112, via plating 114, and a dielectric material 116. Signal trace 104 may be on the surface of printed circuit board 100, such as on the surface of dielectric material 116. In an example, via plating 114 along via 102 may electrically connect signal trace 104 with signal layer 106 within printed circuit board 100. In this example, the portion of via plating 114 of via 102 beyond signal layer 106 may create a stub 120, which in turn may create signal reflections. In certain examples, as a signal is transmitted along signal trace 104, down via plating 114, and into signal layer 106, a portion of the signal may be transmitted into stub 120. The signal may reflect from the end of stub 120 and the reflected signal may cause signal integrity problems with respect to the signal transmitted along signal layer 106.

During previous back drilling operations, drill head tolerances are present on X, Y, and Z axis. Theses tolerances may be both positioning and angular deviations. One type of drilling error of previous back drilling operations may be X-Y positioning errors. X-Y positioning errors may result of previous back drilling operation would result in a full-length stripe. A stripe as used herein is a portion or length of a plating stub that remains in the via after a back drill operation has been performed. In previous back drilling operations, angle errors relative to the Z axis would result in a parabolic shaped stripe. These leftover stripes may be a long stub that is difficult to detect. Printed circuit board 100 may be improved by remove enough of the plating of via stub 120 to prevent signal reflections. Back drilling operations of stub 120 will be described with respect to FIGS. 2-4 below.

Figure 2:
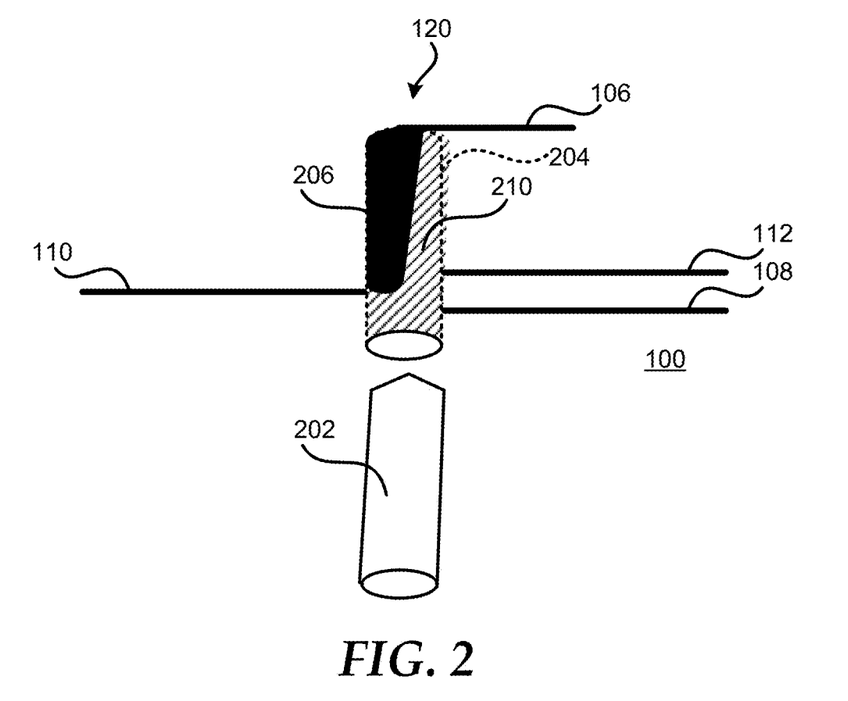
FIGS. 2-4 are perspective views of back drilling stages of a via according to at least one embodiment of the present disclosure.
Figure 3:
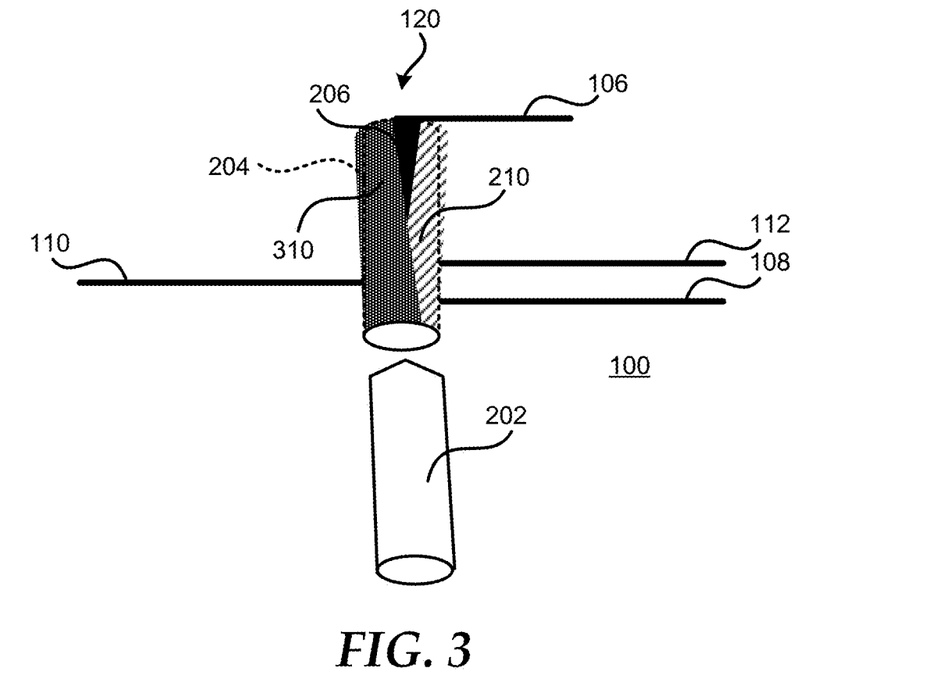
Figure 4:
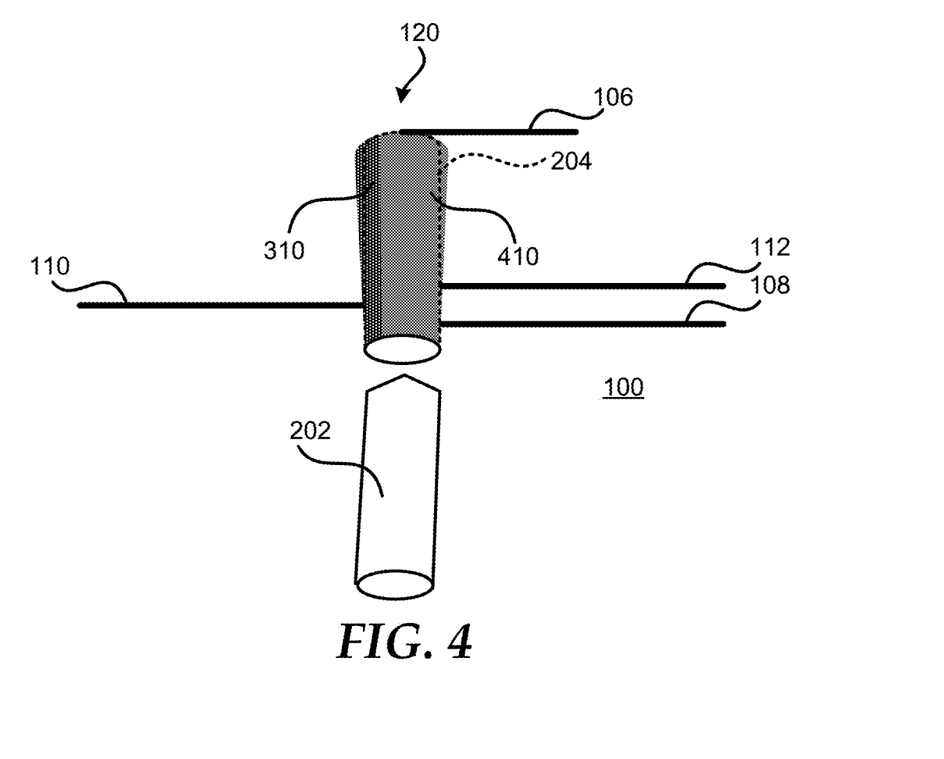

FIGS. 2-4 illustrate a portion of printed circuit board 100 including a portion of via 102, signal layers 106 and 108, ground layers 110 and 112, and stub 120. In an example, signal layer 108 and ground layers 110 and 112 may be routed substantially near stub 120, such that a back drill operation that removes a large amount of printed circuit board 100 around the bottom of stub 120 may be interfere with these layers. In certain examples, manufacturing tolerances of printed circuit board may be small, such as in the order of 2-3 mils and 1-2 degrees. Back drilling operations may accommodate for the small tolerances based on the positioning and angular accuracy of a drill head being repeatable as will be described herein.

Referring to FIG. 2, a first drill angle may be set for a drill head 202. In an example, the drill angle may be set by any suitable manner. For example, the angle may be set by tilting a bed holding printed circuit board 100, tilting drill head 202, or the like. In an example, the drill may be angled from a Z axis in the ZX plane by any suitable amount, such as +1 degree, +2 degrees, +3 degrees, or the like. After the drill head angle has been set, a back drill operation of via stub 120 may be performed with drill head 202 at the first drill angle. In an example, the angle of the drill during back drill may remove a portion 210 of via stub 120. In certain examples, at the bottom of via stub 120, the angle of drill head 202 during the back drilling operation may cause the via plating 114 to be removed without a substantial amount of the dielectric of printed circuit board 100 being removed. At the top of via stub 120, the angle of drill head 202 may cause the via plating and a portion of the dielectric of printed circuit board 100 to be removed as illustrated by a portion of section 210 extending beyond a dashed line 204. Dashed line 204 may indicate an outer edge of via 102 before the back drilling operation was performed. In an example, a larger amount of the dielectric of printed circuit board 100 may be removed at the top of the via stub as compared to the bottom portion of the via stub. After the back drilling operation, a stripe 206 may remain for via stub 120. In an example, stripe 206 may be any suitable shape including, but not limited to, a parabolic stripe.

Referring to FIG. 3, a second drill head angle may be set for a drill head. In an example, the drill may be angled from a Z axis in an amount substantially equal to the first drill head angle. In certain examples, drill head 202 may be tilted from the ZX plane in another plane in any suitable amount, such as +115 degrees, +120 degrees, +125 degrees, or the like. A back drill of via stub 120 may be performed. The angle/tilt of drill head 202 during back drill may remove a portion 310 of via stub 120. At the bottom of the via stub, the angle of drill head 202 during the back drilling operation may cause a different portion 310 the via plating, as compared to the first back drilling, to be removed without a substantial amount of the dielectric of printed circuit board 100 being removed. In an example, a larger amount of the dielectric of printed circuit board 100 may be removed at the top of the via stub as compared to the bottom portion of the via stub, as illustrated by portion 310 extending beyond dashed line 204 in FIG. 3. After this back drill operation, stripe 206 may now be reduced to a narrow sliver.

Referring now to FIG. 4, another drill head angle may be set. In an example, the drill head angle may be angled from a Z axis by any suitable amount, such as +1 degree, +2 degrees, +3 degrees, or the like, and tilted from the ZX plane in another plane in any suitable amount, such as −115 degrees, −120 degrees, −125 degrees, or the like. A back drilling operation of via stub 120 may be performed with drill head 202 at the new angle. This angle/tilt of drill head 202 may remove a portion 410 of via stub 120. Portion 410 of the via plating of stub 120 may be different, as compared to portions 210 and 310. At the top of the via stub, the angle of drill head 202 may cause a different portion of the via plating and a different portion of the dielectric of printed circuit board 100 to be removed. In an example, a larger amount of the dielectric of printed circuit board 100 may be removed as illustrated by portion 410 extending beyond dashed line 204. After this back drill operation, stub 120 may be completely removed. While only three back drilling operations with three drill head angles have been described, the back drilling may include any additional number of back drill operations and drill head angles without varying from the scope of this disclosure.

Figure 5:
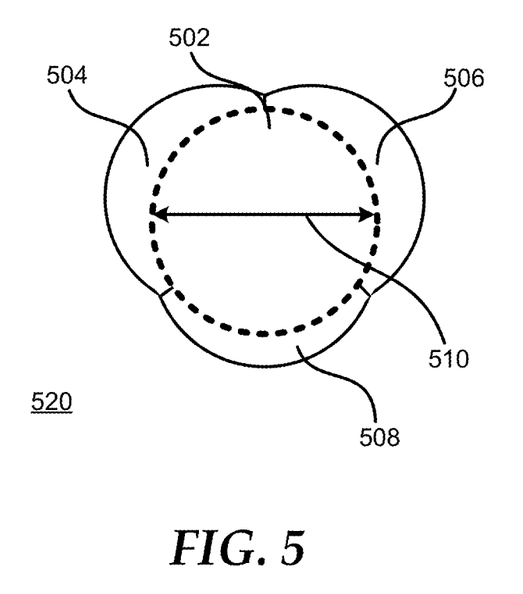
FIG. 5 is a top view of a via stub with multiple back drill locations according to at least one embodiment of the present disclosure.

FIG. 5 illustrates a via stub 502 and back drill locations 504, 506, and 508 according to at least one embodiment of the present disclosure. Via stub 502 includes a diameter 510. In an example, via stub 502, and back drill locations 504, 506, and 508 may be located within a dielectric material 520 of a printed circuit board, such as printed circuit board 100 of FIGS. 1-4. Drill head 202 may be angled slightly different between each drill operation associated with a different one of drill locations 504, 506, and 508.

At the top of via stub 502, a back drilled hole, formed from back drill locations 504, 506, and 508, is larger than drill diameter 510 of the via stub. As described above with respect to FIGS. 2-4, at the bottom of the via stub 502, the back drilled hole may be substantially equal to the drill diameter, such that the other board layers may be in proximity to a smaller back drill diameter. In an example, the other board layers may include, but are not limited to, signal layer 108 and ground layers 110 and 112 of FIG. 1. Based on the smaller back drill diameter, the other board layers may have tighter anti-pads for better routing space and power plane integrity.

Referring to FIG. 1, while removal of a single via stub 120 has been described with respect to FIGS. 1-4, multiple via stubs on via 102 in printed circuit board 100 may be removed without varying from the scope of this disclosure. For example, via 102 may electrically couple signal layers 106 and 108, such that a top stub is created between the top surface of dielectric material 116 and signal layer 106 and a bottom stub is created between the bottom surface of the dielectric material and signal layer 108. In this example, both top and bottom stubs may be removed in a substantially similar manner as described with respect to stub 120 in FIGS. 2-4, such that plating 114 will only remain on via 102 from signal layer 106 to signal layer 108.

Figure 6:
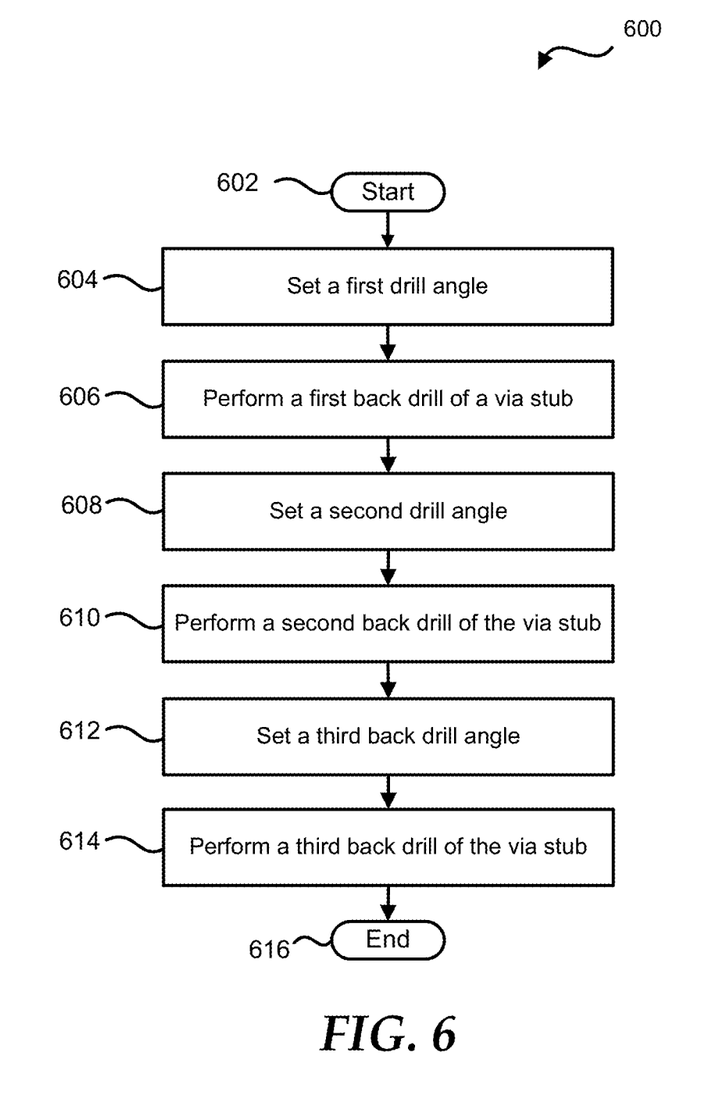
FIG. 6 is a flow diagram of a method for back drilling a via in a printed circuit board according to at least one embodiment of the present disclosure.

FIG. 6 illustrates a flow of a method 600 for back drilling a via of a printed circuit board to prevent striping according to at least one embodiment of the present disclosure, starting at block 602. It will be readily appreciated that not every method step set forth in this flow diagram is always necessary, and that certain steps of the methods may be combined, performed simultaneously, in a different order, or perhaps omitted, without varying from the scope of the disclosure.

At block 604, a first drill angle is set. In an example, the drill angle may be set by any suitable manner. For example, the angle may be set by tilting a bed holding the printed circuit board, tilting the drill head, or the like. In an example, the drill may be angled from a Z axis in the ZX plane by any suitable amount, such as +1 degree, +2 degrees, +3 degrees, or the like.

At block 606, a first back drill of the via stub is performed. In an example, the angle of the drill during back drill may remove a portion of the via stub. In certain examples, at the bottom of the via stub, the angle of the drill during the back drilling operation may cause the via plating to be removed without a substantial amount of the dielectric of the printed circuit board being removed. At the top of the via stub, the angle of the drill during the back drilling operation may cause the via plating and a portion of the dielectric of the printed circuit board to be removed. In an example, a larger amount of the dielectric of the printed circuit board may be removed at the top of the via stub as compared to the bottom portion of the via stub.

At block 608, a second drill angle is set. In an example, the drill angle may be set by any suitable manner. For example, as stated above with respect to the first drill angle, the angle may be set by tilting the bed holding the printed circuit board, tilting the drill head, or the like. In an example, the drill may be angled from a Z axis by any suitable amount, such as +1 degree, +2 degrees, +3 degrees, or the like, and tilted from the ZX plane in another plane in any suitable amount, such as +115 degrees, +120 degrees, +125 degrees, or the like.

At block 610, a second back drill of the via stub is performed. The angle/tilt of the drill during back drill may remove a portion of the via stub. At the bottom of the via stub, the angle of the drill during the back drilling operation may cause a different portion the via plating, as compared to the first back drilling, to be removed without a substantial amount of the dielectric of the printed circuit board being removed. At the top of the via stub, the angle of the drill during the back drilling operation may cause a different portion the via plating and a different portion of the dielectric of the printed circuit board to be removed, as compared to the first and second back drilling. In an example, a larger amount of the dielectric of the printed circuit board may be removed at the top of the via stub as compared to the bottom portion of the via stub.

At block 612, a third drill angle is set. As stated above with respect to the first and second drill angles, the angle may be set by tilting the bed holding the printed circuit board, tilting the drill head, or the like. In an example, the drill may be angled from a Z axis by any suitable amount, such as +1 degree, +2 degrees, +3 degrees, or the like, and tilted from the ZX plane in another plane in any suitable amount, such as −115 degrees, −120 degrees, −125 degrees, or the like.

At block 614, a third back drill of the via stub is performed and the flow ends at block 616. The angle/tilt of the drill head during back drill may remove a portion of the via stub. At the bottom of the via stub, the angle of the drill during the back drilling operation may cause a different portion the via plating, as compared to the first and second back drilling, to be removed without a substantial amount of the dielectric of the printed circuit board being removed. At the top of the via stub, the angle of the drill during the back drilling operation may cause a different portion the via plating and a different portion of the dielectric of the printed circuit board to be removed, as compared to the first and second back drilling. In an example, a larger amount of the dielectric of the printed circuit board may be removed at the top of the via stub as compared to the bottom portion of the via stub.

Figure 7:
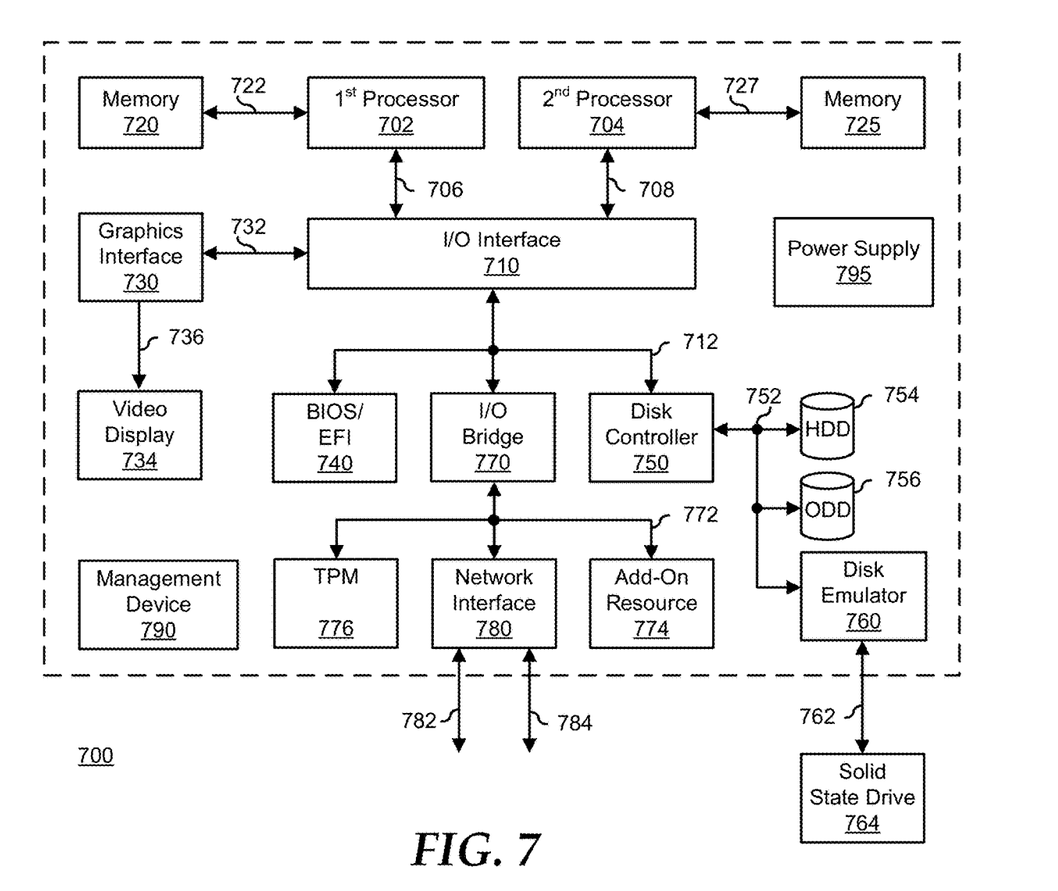
FIG. 7 is a block diagram of a general information handling system according to an embodiment of the present disclosure.

FIG. 7 shows a generalized embodiment of an information handling system 700 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 764, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 764, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732 and provides a video display output 736 to a video display 734. In a particular embodiment, information handling system 700 includes separate memories that are dedicated to each of processors 702 and 704 via separate memory interfaces. An example of memories 720 and 725 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 4394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712 or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700.

Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A printed circuit board comprising:
   a dielectric material;
   a signal trace on a surface of the dielectric material;
   a signal layer within the dielectric material;
   a via including plating, the plating providing an electrical communication between the signal trace and the signal layer, wherein the via has a diameter; and
   a plurality of back drill locations along a length of the via beyond the signal layer, wherein a first combined diameter of the back drill locations at a bottom of the back drill locations is equal to the dimeter of the via, and wherein a second combined diameter of the back drill locations at a top of the back drill locations is greater than the dimeter of the via, wherein the back drill locations include first, second, and third back drill locations.

2. The printed circuit board of claim 1, further comprising: a plurality of layers in close proximity to the bottom portion of the back drill locations.

3. The printed circuit board of claim 1, wherein the plating within the via ends at a bottom surface of the signal layer.

4. The printed circuit board of claim 1, wherein each of the first, second, and third back drill locations are angled by a same degree from a Z axis of the via.

5. The printed circuit board of claim 1, wherein the first back drill location is tilted a first number degrees away from a ZX plane of the via.

6. The printed circuit board substrate of claim 5, wherein the second back drill location is tilted a second number degrees away from the ZX plane of the via.

7. The printed circuit board of claim 6, wherein the second back drill location is tilted a second number degrees away from the ZX plane of the via.

8. A printed circuit board comprising:
   a dielectric material;
   a signal trace on a surface of the dielectric material;
   a signal layer within the dielectric material;
   a via including plating, the plating providing an electrical communication between the signal trace and the signal layer, wherein the via has a diameter, wherein the plating within the via ends at a bottom surface of the signal layer;
   a plurality of back drill locations along a length of the via beyond the signal layer, wherein a first combined diameter of the back drill locations at a bottom of the back drill locations is equal to the dimeter of the via, and a second combined diameter of the back drill locations at a top of the back drill locations is greater than the dimeter of the via, wherein the back drill locations include first, second, and third back drill locations; and
   a plurality of layers proximate to the bottom portion of the back drill locations.

9. The printed circuit board of claim 8, wherein each of the first, second, and third back drill locations are angled by a same degree from a Z axis of the via.

10. The printed circuit board of claim 8, wherein the first back drill location is tilted a first number degrees away from a ZX plane of the via.

11. The printed circuit board of claim 10, wherein the second back drill location is tilted a second number degrees away from the ZX plane of the via.

12. The printed circuit board of claim 8, wherein the second back drill location is tilted a second number degrees away from the ZX plane of the via.

* * * * *